United States Patent
Park et al.

(10) Patent No.: US 9,209,287 B2
(45) Date of Patent: Dec. 8, 2015

(54) POWER SEMICONDUCTOR DEVICE

(71) Applicant: SAMSUNG ELECTRO-MECHANICS CO., LTD., Suwon-Si, Gyeonggi-Do (KR)

(72) Inventors: Jae Hoon Park, Suwon-Si (KR); Ji Hye Kim, Suwon-Si (KR); Kyu Hyun Mo, Suwon-Si (KR); Ji Yeon Oh, Suwon-Si (KR); Dong Soo Seo, Suwon-Si (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/271,075

(22) Filed: May 6, 2014

(65) Prior Publication Data

US 2015/0187920 A1   Jul. 2, 2015

(30) Foreign Application Priority Data

Dec. 27, 2013   (KR) .................. 10-2013-0165242

(51) Int. Cl.
*H01L 29/739*   (2006.01)
*H01L 29/06*   (2006.01)
*H01L 29/10*   (2006.01)

(52) U.S. Cl.
CPC ........ *H01L 29/7397* (2013.01); *H01L 29/0696* (2013.01); *H01L 29/1095* (2013.01)

(58) Field of Classification Search
CPC ................. H01L 29/7813; H01L 2924/1305; H01L 29/1095; H01L 29/1766; H01L 29/4236; H01L 29/66734; H01L 29/66666; H01L 29/7395
See application file for complete search history.

(56) References Cited

U.S. PATENT DOCUMENTS

| | | |
|---|---|---|
| 2005/0067661 A1 | 3/2005 | Choi |
| 2005/0208724 A1* | 9/2005 | Cao et al. ..................... 438/270 |
| 2011/0006363 A1* | 1/2011 | Hsieh ............................ 257/330 |
| 2012/0276728 A1* | 11/2012 | Yoshimochi .................. 438/586 |
| 2013/0153926 A1* | 6/2013 | Masuda et al. ................. 257/77 |

FOREIGN PATENT DOCUMENTS

| | | |
|---|---|---|
| JP | 2008-516454 A | 5/2008 |
| KR | 10-0982420 B1 | 9/2010 |
| WO | 2006/042040 A2 | 4/2006 |

* cited by examiner

*Primary Examiner* — Khaja Ahmad
(74) *Attorney, Agent, or Firm* — McDermott Will & Emery LLP

(57) ABSTRACT

A power semiconductor device may include: a first conductivity-type first semiconductor region; a second conductivity-type second semiconductor region disposed above the first semiconductor region; a trench gate penetrating through the second semiconductor region and a portion of the first semiconductor region; a third semiconductor region disposed on both sides of the trench gate and disposed on an inner side of an upper portion of the second semiconductor region; and a device protective region disposed in the third semiconductor region.

8 Claims, 6 Drawing Sheets

US 9,209,287 B2

POWER SEMICONDUCTOR DEVICE

CROSS-REFERENCE TO RELATED APPLICATION

This application claims the benefit of Korean Patent Application No. 10-2013-0165242 filed on Dec. 27, 2013, with the Korean Intellectual Property Office, the disclosure of which is incorporated herein by reference.

BACKGROUND

The present disclosure relates to a power semiconductor device having enhanced reliability.

An insulated-gate bipolar transistor (IGBT) is a transistor with a gate manufactured by using a metal-oxide semiconductor (MOS) structure and forming a p-type collector layer on a rear surface thereof having bipolarity.

Since the development of conventional power Metal-Oxide Semiconductor Field Emission Transistors (MOSFET), such MOSFETs have been used in fields in which fast switching characteristics are required.

However, due to inherent structural limitations of MOSFETs, bipolar transistors, thyristors, gate turn-off thyristors (GTO), and the like, have been used in fields in which high voltage are required.

IGBTs, featuring low forward loss and fast switching speeds, tend to extendedly applied to applications in various fields for which existing thyristors, bipolar transistors, MOSFETs, and the like are unsuitable.

As for an operating principle of an IGBT, in the case that an IGBT device is turned on and a voltage higher than that of a cathode is applied to an anode, while a voltage higher than a threshold value of the device is applied to a gate electrode, a polarity of a surface of a p-type body region positioned in a lower end portion of the gate electrode is reversed to form an n-type channel.

An electron current injected into a drift region through the n-type channel induces injection of a hole current from a p-type collector layer having a high concentration positioned in a lower portion of the IGBT device, such as a base current of a bipolar transistor.

The injection of the minority carrier having a high concentration, increases conductivity in the drift region by tens to hundreds of times (an order of magnitude of one or two), causing conductivity modulation.

Unlike a MOSFET, a resistance component in the drift region may be reduced in size to be significantly low due to the conductivity modulation, and thus, extremely high voltages may be applied to IGBT devices.

A current flowing to a cathode may be divided into an electron current, flowing through a channel, and a hole current, flowing through a junction between a p-type body and an n-type drift region.

An IGBT may have a PNP structure between an anode and a cathode in terms of a substrate structure, so unlike a MOSFET, a diode may not be installed, and thus, a separate diode may need to be connected to an IGBT through an inverse-parallel connection.

Major characteristics of IGBTs include maintaining a blocking voltage, reducing conduction loss, and increasing a switching speed.

As for a structure of an IGBT, an IGBT includes an n+-type emitter region, a p-type body region an n− drift region, and a p+-type collector region, and thus, a PNPN parasitic thyristor structure exists.

Once the parasitic thyristor operates, the IGBT may not be subjected to being controlled by a gate any longer and a large amount of current may flow to an anode and a cathode to generate a high level of heat to burn the device.

The phenomenon in which a parasitic thyristor is increased is called latch-up.

Latch-up drastically lowers reliability of a device, and thus, a scheme for preventing latch-up is required.

SUMMARY

An aspect of the present disclosure may provide a power semiconductor device having enhanced reliability.

According to an aspect of the present disclosure, a power semiconductor device may include: a first conductivity-type first semiconductor region; a second conductivity-type second semiconductor region disposed above the first semiconductor region; a trench gate penetrating through the second semiconductor region and a portion of the first semiconductor region; a third semiconductor region disposed on both sides of the trench gate and disposed on an inner side of an upper portion of the second semiconductor region; and a device protective region disposed in the third semiconductor region.

The device protective region may be formed of NiSi.

The device protective region may be disposed in at least a portion of regions in which the third semiconductor region and the second semiconductor region are in contact.

The device protective region may be disposed below the third semiconductor region.

The device protective region may be disposed on the side of the third semiconductor region.

According to another aspect of the present disclosure, a power semiconductor device may include: a first conductivity-type first semiconductor region; a second conductivity-type second semiconductor region disposed above the first semiconductor region; a trench gate penetrating through the second semiconductor region and a portion of the first semiconductor region; and a third semiconductor region disposed on both sides of the trench gate and disposed on an inner side of an upper portion of the second semiconductor region, wherein the third semiconductor region is formed of NiSi.

According to another aspect of the present disclosure, a power semiconductor device may include: a first conductivity-type first semiconductor region; a second conductivity-type second semiconductor region disposed above the first semiconductor region; a trench gate penetrating through the second semiconductor region and a portion of the first semiconductor region; a third semiconductor region disposed on both sides of the trench gate and disposed on an inner side of an upper portion of the second semiconductor region; and a device protective region disposed in the second semiconductor region.

The device protective region may be formed of NiSi.

The device protective region may be disposed below the third semiconductor region.

The power semiconductor device may further include: a channel region disposed when the device is turned on in a portion in which the trench gate and the second semiconductor region are in contact, and the device protective region may be disposed to be spaced apart from the trench gate by a width of the channel region.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
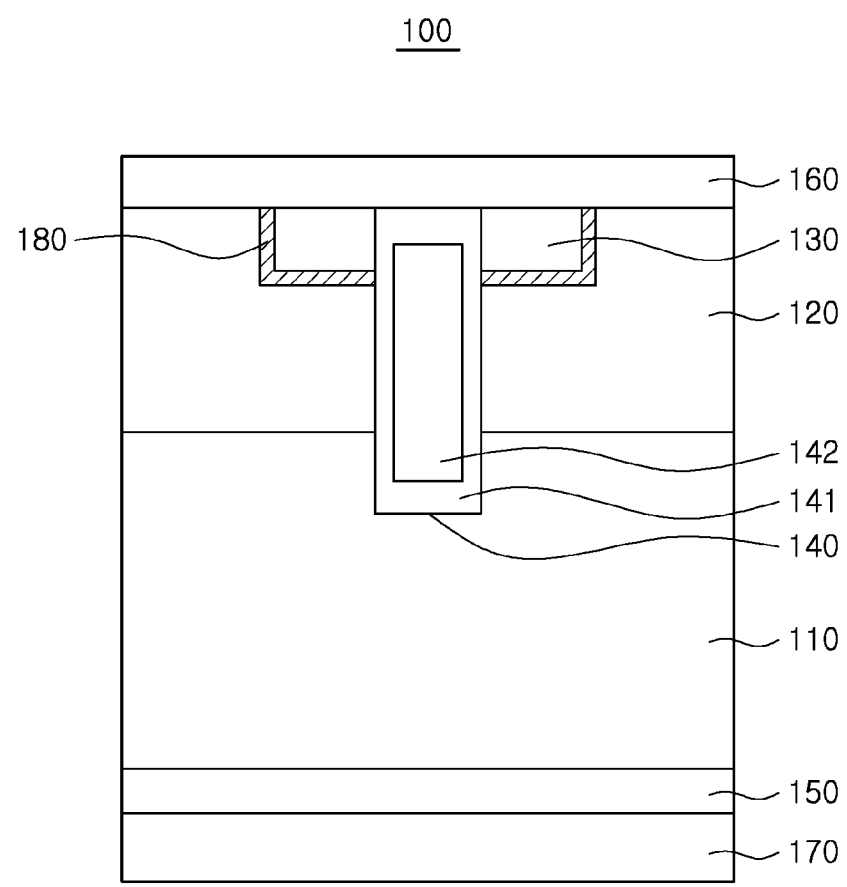
FIG. 1 is a cross-sectional view schematically illustrating a power semiconductor device according to an exemplary embodiment of the present disclosure.

Hereinafter, embodiments of the present disclosure will be described in detail with reference to the accompanying drawings. The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. In the drawings, the shapes and dimensions of elements may be exaggerated for clarity, and the same reference numerals will be used throughout to designate the same or like elements.

A power switch may be implemented by any one of a power metal-oxide semiconductor field emission transistor (MOSFET), an insulated-gate bipolar transistor (IGBT), various types of thyristor, or the like. Most new techniques disclosed herein will be described based on IGBTs. However, various exemplary embodiments disclosed herein are not limited to IGBTs and may be applied to any type of power switch technique, including power MOSFETs and various types of thyristors, besides IGBTs. In addition, various exemplary embodiments of the present disclosure are described to include particular p-type and n-type regions. However, obviously, the exemplary embodiments described herein may also be applied to devices including regions having opposite conductivity types in the same manner.

Also, as used herein, p-type and n-type may be defined as a first conductivity-type or a second conductivity-type. Meanwhile, first and second conductivity-types refer to different conductivity-types.

Also, in general, positive (+) refers to an element doped at a high concentration and negative (−) refers to an element state doped at a low concentration.

Hereinafter, for clarification, a first conductivity-type will be referred to as an n-type, while a second conductivity-type will be referred to as a p-type, but the present disclosure is not limited thereto.

Also, a first semiconductor region will be referred to as a drift region, a second semiconductor region will be referred to as a body region, and a third semiconductor region will be referred to as an emitter region, but the present disclosure is not limited thereto.

FIG. 1 is a cross-sectional view schematically illustrating a power semiconductor device 100 according to an exemplary embodiment of the present disclosure.

A structure of the power semiconductor device 100 according to an exemplary embodiment of the present disclosure will be described with reference to FIG. 1. The power semiconductor device 100 according to an exemplary embodiment of the present disclosure may include a collector region 150, a drift region 110, a body region 120, an emitter region 130, and a device protective layer 180.

The drift region 110 may be formed by injecting an n-type impurity having a low concentration.

Thus, the drift region 110 may have a relatively large thickness to maintain a blocking voltage of the device.

The drift region 110 may further include a buffer region (not shown) formed on a lower surface thereof.

The buffer region may be formed by injecting an n-type impurity into a rear surface of the drift region 110.

The buffer region may serve to hinder expansion of a depletion region of the device, helping maintain a blocking voltage of the device.

Thus, when the buffer region is formed, the drift region 110 may be formed to be thinner, reducing the size of the power semiconductor device.

The body region 120 may be formed by injecting a p-type impurity into an upper surface of the drift region 110.

The body region 120 may have p-type conductivity, forming a p-n junction with the drift region 110.

The emitter region 130 may be formed by injecting an n-type impurity having a high concentration into the interior of the upper surface of the body region 120.

A trench gate 140 may be formed to penetrate from the emitter region 130, through the body region 120, to the drift region 110.

Namely, the trench gate 140 may be formed to penetrate from the emitter region 130 into a portion of the drift region 110.

The trench gate 140 may be formed extendedly in one direction and may be arranged at a predetermined interval in a direction perpendicular to the direction in which the trench gate 140 is formed extendedly.

A gate insulating layer 141 may be formed in a portion where the trench gate 140 is in contact with the drift region 110, the body region 120, and the emitter region 130.

The gate insulating layer 141 may be formed of silicon oxide ($SiO_2$), but the present disclosure is not limited thereto.

The interior of the trench gate 140 may be filled with a conductive material 142.

The conductive material 142 may be polysilicon (Poly-Si) or a metal, but the present disclosure is not limited thereto.

The conductive material 142 is electrically connected to a gate electrode (not shown) to control an operation of the power semiconductor device 100 according to the exemplary embodiment of the present disclosure.

In the case that a positive (+) voltage is applied to the conductive material 142, a channel C is formed in the body region 120.

In detail, in the case that a positive (+) voltage is applied to the conductive material 142, electrons present in the body region 120 are attracted toward the trench gate 140, so electrons gathering at the trench gate 140 form a channel.

Namely, the trench gate 140 attracts electrons to form a channel in a depletion region with no carriers due to electron-hole recombination occurring at a p-n junction, allowing a current to flow.

The collector region 150 may be formed by injecting a p-type impurity into a lower surface of the drift region 110 or a lower surface of the buffer region.

In a case in which the power semiconductor device is an insulated-gate bipolar transistor (IGBT), the collector region 150 may provide holes to the power semiconductor device 100.

The injection of holes, minority carriers, having a high concentration causes conductivity modulation in which conductivity is increased by tens to hundreds of times in the drift region 110.

An emitter metal layer 160 may be formed on the emitter region 130 and an exposed upper surface of the body region 120, and a collector metal layer 170 may be formed on a lower surface of the collector region 150.

As described above, the power semiconductor device according to the present exemplary embodiment may have a parasitic thyristor having a PNPN structure from a lower portion thereof.

Once the parasitic thyristor operates, the IGBT may not be subjected to be controlled by a gate any longer and a large amount of current flows to an anode and a cathode to generate a high level of heat to burn the device.

The phenomenon in which a parasitic thyristor is increased is called latch-up.

The principle of generating latch-up will be described in detail hereinafter. When a power semiconductor device operates, an electron current flows along a channel and a hole current moves across the junction of the body region 120 to flow to the emitter electrode 160.

Since the electron current is injected into the drift region 110 below the trench gate 140 along the channel to increase conductivity of the region, the majority of hole current is injected into the body region 120 below the channel and flow to the emitter metal layer 160 through a lower portion of the emitter region 130.

In the case that the hole current is increased and a voltage drop in a lower portion of the emitter region 130 is greater than a potential barrier of an interface between the emitter region 130 and the body region 120, making the junction forward biased, electrons are injected from the emitter region 130 into the body region 120 and a parasitic NPN thyristor including the n-type emitter region 130, the p-type body region 120, and the n-type drift region 110 operates.

Thus, the hole current needs to be prevented from being increased in a lower portion of the emitter region 130.

Referring to FIG. 1, in the power semiconductor device 100 according to the present exemplary embodiment, a portion of the emitter region 130 may be formed as a device protective region 180.

The device protective region 180 may be formed of a material constituting a Schottky junction with respect to the body region 120.

For example, the device protective region 180 may be formed of NiSi.

Since a portion of the emitter region 130 is formed as the device protective region, an amount of hole current flowing in a lower portion of the emitter region 130 may be reduced.

Thus, an operation of a parasitic thyristor may be hindered, preventing the occurrence of latch-up to damage the power semiconductor device 100.

The device protective region 180 may be formed in at least a portion of a region in which the emitter region 130 and the body region 120 are in contact, but the present disclosure is not limited thereto.

As illustrated in FIG. 1, the device protective region 180 may be formed in a portion in which the emitter region 130 and the body region 120 are in contact.

Since the device protective region 180 is formed in a portion where the emitter region 130 and the body region 120 are in contact, an operation of a parasitic thyristor may be hindered, thus preventing the occurrence of latch-up to damage the power semiconductor device.

Figure 2:
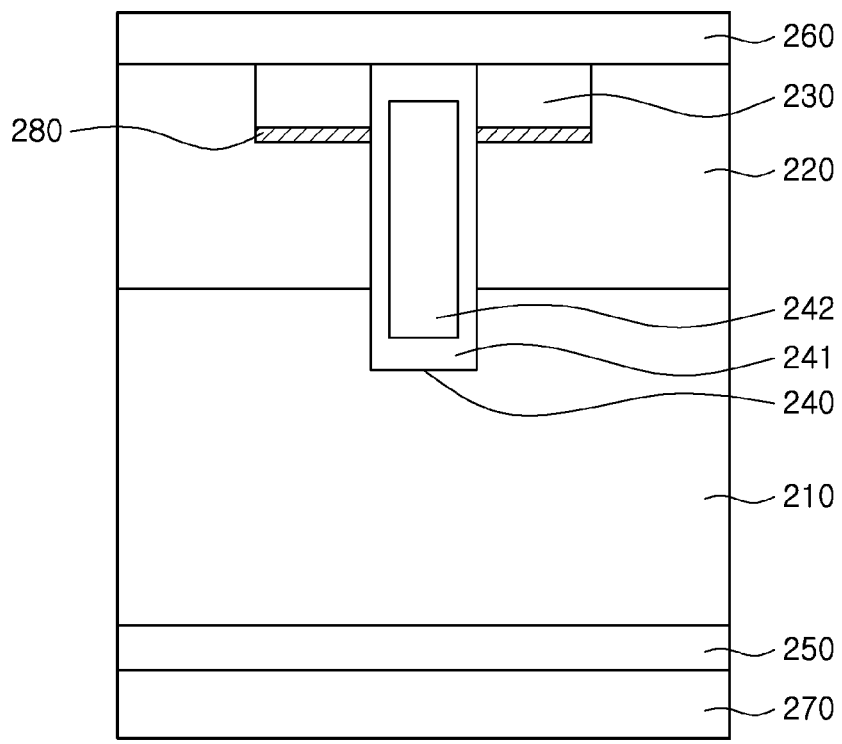
FIG. 2 is a cross-sectional view schematically illustrating a power semiconductor device according to another exemplary embodiment of the present disclosure.

FIG. 2 is a cross-sectional view schematically illustrating a power semiconductor device 200 according to another exemplary embodiment of the present disclosure.

Referring to FIG. 2, a device protective region 280 may be formed on a lower surface of an emitter region 230.

As an electron current flows through a channel formed in a body region, a large amount of hole current may flow in the lower portion of the emitter region 230.

Thus, by forming the device protective region 280 on the lower surface of the emitter region 230, an operation of a parasitic thyristor may be hindered, preventing the occurrence of latch-up to damage the power semiconductor device 200.

Figure 3:
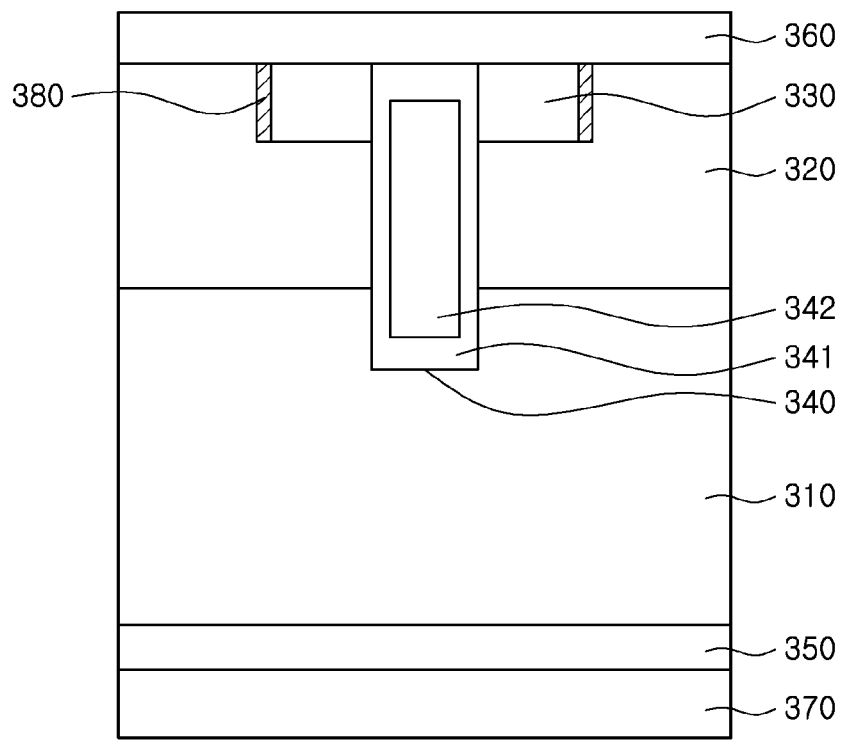
FIG. 3 is a cross-sectional view schematically illustrating a power semiconductor device according to another exemplary embodiment of the present disclosure.

FIG. 3 is a cross-sectional view schematically illustrating a power semiconductor device 300 according to another exemplary embodiment of the present disclosure.

Referring to FIG. 3, a device protective region 380 may be formed on sides of the emitter region 330.

A hole current may flow through the body region 320 through the emitter metal layer 360.

Thus, the hole current may inevitably pass by way of the body region 320 positioned on the sides of the emitter region 320.

Thus, by positioning the device protective region on the sides of the emitter region 330, an operation of a parasitic thyristor may be hindered, preventing the occurrence of latch-up to damage the power semiconductor device 300.

Figure 4:
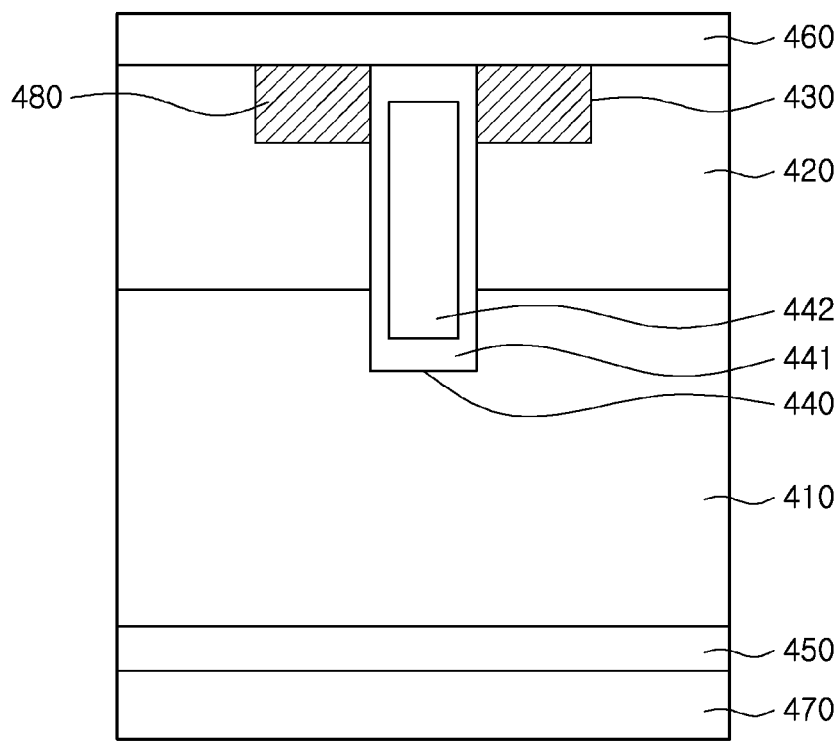
FIG. 4 is a cross-sectional view schematically illustrating a power semiconductor device according to another exemplary embodiment of the present disclosure.

FIG. 4 is a cross-sectional view schematically illustrating a power semiconductor device 400 according to another exemplary embodiment of the present disclosure.

Referring to FIG. 4, an emitter region 430 may be formed of NiSi.

In the case in which the emitter region 430 is formed of NiSi, since an interface between a body region 420 and the emitter region 430 becomes a Schottky junction, it is difficult for a hole current to flow.

Thus, an operation of a parasitic thyristor may be hindered, preventing the occurrence of latch-up to damage the power semiconductor device 400.

The emitter region 430 may be formed of NiSi and may be formed by injecting an n-type impurity.

Figure 5:
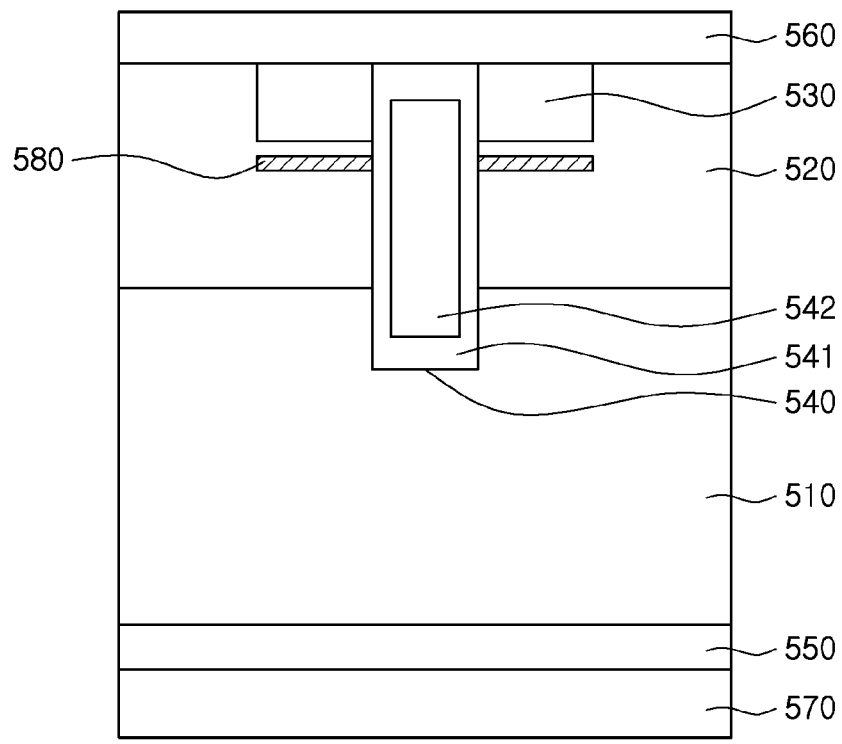
FIG. 5 is a cross-sectional view schematically illustrating a power semiconductor device according to another exemplary embodiment of the present disclosure.

FIG. 5 is a cross-sectional view schematically illustrating a power semiconductor device 500 according to another exemplary embodiment of the present disclosure.

Referring to FIG. 5, in the power semiconductor device 500 according to another exemplary embodiment of the present disclosure, a device protective region 580 may be formed in a body region 520, rather than in an emitter region 530.

In the case in which the device protective region 580 is positioned in the body region 520, the device protective region 580 and the body region 520 form a Schottky junction.

Thus, the device protective region 580 may serve as a barrier with respect to a hole current.

For example, in the case in which the device protective region 580 is formed in the body region 520 and is positioned below the emitter region 530, a hole current may be released through an emitter metal layer 560 by detouring around the device protective region 580, before being brought into contact with a lower surface of the emitter region.

Thus, in the case in which the device protective region 580 is formed in the body region 520, an operation of a parasitic thyristor may be hindered, preventing the occurrence of latch-up to damage the power semiconductor device 500.

Figure 6:
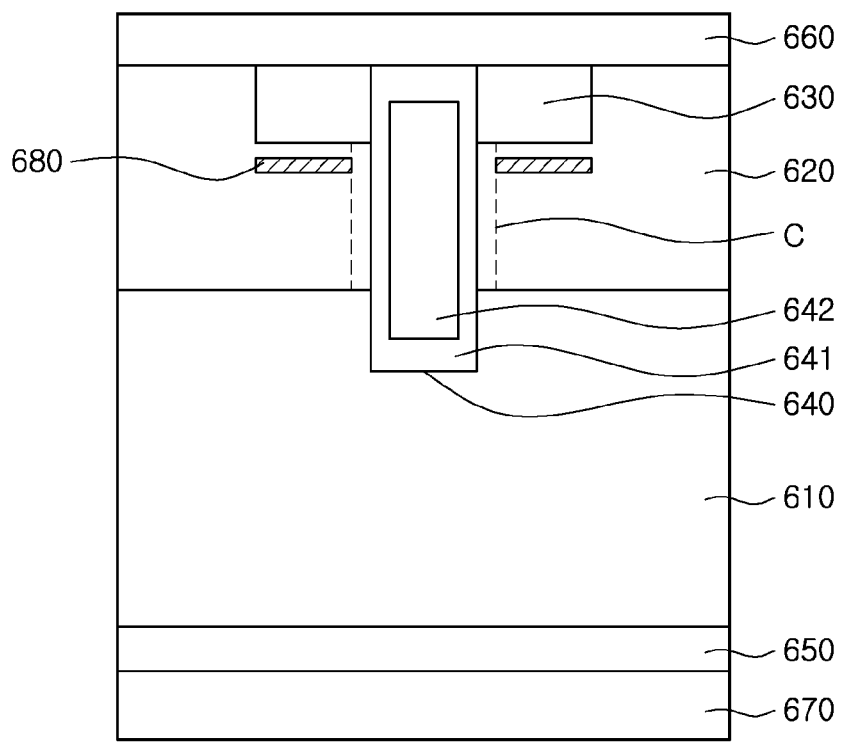
FIG. 6 is a cross-sectional view schematically illustrating a power semiconductor device according to another exemplary embodiment of the present disclosure.

FIG. 6 is a cross-sectional view schematically illustrating a power semiconductor device 600 according to another exemplary embodiment of the present disclosure.

As illustrated in FIG. 6, when the power semiconductor device 600 is turned on, a channel region C is formed in portions in which a body region 620 is in contact with a trench gate 640.

An electron current mainly flows through the channel region C.

Thus, when a device protective region 680 is formed to be spaced apart from the trench gate 640 by a width of the channel region C, an operation of a parasitic thyristor may be hindered, while not interfering with a flow of an electron current.

Thus, in the power semiconductor device 500 according to another exemplary embodiment of the present disclosure, occurrence of latch-up in the power semiconductor device may be minimized, while minimizing a reduction in an electron current.

As set forth above, the power semiconductor device according to exemplary embodiments of the present disclosure includes a device protective region having a p-type body region and a Schottky junction, holes may be prevented from entering an n-type emitter region.

Since holes are prevented from entering the emitter region, latch-up may be prevented, enhancing device reliability.

While exemplary embodiments have been shown and described above, it will be apparent to those skilled in the art that modifications and variations could be made without departing from the spirit and scope of the present disclosure as defined by the appended claims.

What is claimed is:

1. A power semiconductor device comprising:
   a first conductivity-type first semiconductor region;
   a second conductivity-type second semiconductor region disposed above the first semiconductor region;
   a trench gate penetrating through the second semiconductor region and a portion of the first semiconductor region;
   a third semiconductor region disposed on both sides of the trench gate and disposed on an inner side of an upper portion of the second semiconductor region; and
   a device protective region disposed in the third semiconductor region,
   wherein the device protective region is disposed in at least a portion of an interface between the third semiconductor region and the second semiconductor region.

2. The power semiconductor device of claim 1, wherein the device protective region is formed of NiSi.

3. The power semiconductor device of claim 1, wherein the device protective region is disposed below the third semiconductor region.

4. The power semiconductor device of claim 1, wherein the device protective region is disposed on the side of the third semiconductor region.

5. A power semiconductor device comprising:
   a first conductivity-type first semiconductor region;
   a second conductivity-type second semiconductor region disposed above the first semiconductor region;
   a trench gate penetrating through the second semiconductor region and a portion of the first semiconductor region;
   a third semiconductor region disposed on both sides of the trench gate and disposed on an inner side of an upper portion of the second semiconductor region; and
   a device protective region disposed in the second semiconductor region,
   wherein the device protective region is disposed in at least a portion of an interface between the third semiconductor region and the second semiconductor region.

6. The power semiconductor device of claim 5, wherein the device protective region is formed of NiSi.

7. The power semiconductor device of claim 5, wherein the device protective region is disposed below the third semiconductor region.

8. The power semiconductor device of claim 5, further comprising a channel region disposed when the device is turned on in a portion in which the trench gate and the second semiconductor region are in contact, wherein the device protective region is disposed to be spaced apart from the trench gate by a width of the channel region.

* * * * *